(12) United States Patent
Hegde et al.

(10) Patent No.: US 10,147,697 B1
(45) Date of Patent: Dec. 4, 2018

(54) BOND PAD STRUCTURE FOR SEMICONDUCTOR DEVICE PACKAGING

(71) Applicant: NXP USA, INC., Austin, TX (US)

(72) Inventors: Rama I. Hegde, Austin, TX (US); Varughese Mathew, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/843,615

(22) Filed: Dec. 15, 2017

(51) Int. Cl.
*H01L 23/495* (2006.01)
*H01L 23/00* (2006.01)
*H01L 23/14* (2006.01)

(52) U.S. Cl.
CPC ............. *H01L 24/48* (2013.01); *H01L 23/14* (2013.01); *H01L 23/49513* (2013.01); *H01L 23/49517* (2013.01); *H01L 23/49541* (2013.01); *H01L 23/49582* (2013.01); *H01L 24/03* (2013.01); *H01L 24/05* (2013.01); *H01L 24/32* (2013.01); *H01L 24/45* (2013.01); *H01L 24/73* (2013.01); *H01L 24/83* (2013.01); *H01L 24/85* (2013.01); *H01L 24/92* (2013.01); *H01L 2224/03462* (2013.01); *H01L 2224/04042* (2013.01); *H01L 2224/05005* (2013.01); *H01L 2224/05012* (2013.01); *H01L 2224/05073* (2013.01); *H01L 2224/05082* (2013.01); *H01L 2224/05147* (2013.01); *H01L 2224/32245* (2013.01); *H01L 2224/45147* (2013.01); *H01L 2224/48091* (2013.01); *H01L 2224/48106* (2013.01); *H01L 2224/48247* (2013.01); *H01L 2224/48847* (2013.01); *H01L 2224/73265* (2013.01); *H01L 2224/92247* (2013.01)

(58) Field of Classification Search
CPC ......... H01L 24/05; H01L 24/48; H01L 24/73; H01L 24/45; H01L 24/83; H01L 24/03; H01L 24/32; H01L 24/85; H01L 23/49513; H01L 23/49517; H01L 23/49541; H01L 23/49582; H01L 23/14; H01L 24/92
USPC ......................................................... 257/676
See application file for complete search history.

(56) References Cited

U.S. PATENT DOCUMENTS

| 5,316,802 | A | 5/1994 | Ebe et al. | |
| 6,593,643 | B1* | 7/2003 | Seki | H01L 23/49582 257/677 |
| 7,695,605 | B2 | 4/2010 | Whitlaw et al. | |
| 8,203,221 | B2* | 6/2012 | Iwasaki | H01L 23/3142 257/787 |

(Continued)

FOREIGN PATENT DOCUMENTS

EP   2045344 B1   5/2012

OTHER PUBLICATIONS

Boo, J., "High-Rate deposition of copper thin films using newly designed high-power magnetron sputtering source"; Surface Coatings Technology 188-189 (2004) 721-727, Aug. 2004.

(Continued)

*Primary Examiner* — Luan C Thai

(57) ABSTRACT

A semiconductor device includes a leadframe having a flag and a plurality of bond terminals. A semiconductor die is attached to the leadframe at the flag. A bond pad is formed on the semiconductor die. A top surface layer of the bond pad includes copper having a predetermined grain orientation. A bond wire includes a first end and a second end. The bond wire is attached to the bond pad at the first end and attached to one of the bond terminals in the plurality at the second end.

20 Claims, 4 Drawing Sheets

(56) References Cited

U.S. PATENT DOCUMENTS

| | | | | |
|---|---|---|---|---|
| 8,319,330 B2* | 11/2012 | Murakami | ............ | H01L 24/48 257/687 |
| 2010/0139822 A1 | 6/2010 | Gao et al. | | |
| 2016/0351487 A1* | 12/2016 | Ogura | ............... | H01L 23/49838 |

OTHER PUBLICATIONS

Kim, J., "Self-annealing effect of electrolessly deposited copper thin films based on Co(II)-ethylenediamine as a reducing agent"; http://www.electrochem.org/dl/ma/202/pdfs/0420.pdf; downloaded Dec. 5, 2017.

Mao, J., "The Influence of Pre-heat Treatment on Peeling Resistance of Oxide Film of Copper Alloy Lead Frames"; 2008 International Conference on Electronic Packaging Technology & High Density Packaging (ICEPT-HDP 2008). IEEE 2008.

* cited by examiner

BOND PAD STRUCTURE FOR SEMICONDUCTOR DEVICE PACKAGING

BACKGROUND

Field

This disclosure relates generally to semiconductor devices, and more specifically, to bond pad structure and formation for semiconductor device packaging.

Related Art

Semiconductor devices are often found in a large spectrum of electronic products—from sewing machines to washing machines, from automobiles to cellular telephones, and so on. Such semiconductor devices generally include an integrated circuit die which communicates with the other devices outside of a package by way of bond wires. As technology progresses, semiconductor manufacturing continues to seek ways to reduce costs and improve reliability in these semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a bond pad structure and method of forming the same. By forming a top surface layer of copper having a <111> grain orientation (Cu <111>) on a bond pad, a copper bond wire can be attached without additional processing steps. Copper offers superior conductivity characteristics with modest costs when compared with other choices for pad metals and bond wires. The Cu <111> top surface layer may be formed by deposition or plating. The Cu <111> top surface layer has minimal oxide growth due to the grain density and allows for direct bonding with a copper bond wire. By directly attaching copper bond wires on Cu <111> bond pads, intermetallic compound formation and associated corrosion susceptibility are virtually eliminated.

Figure 1:
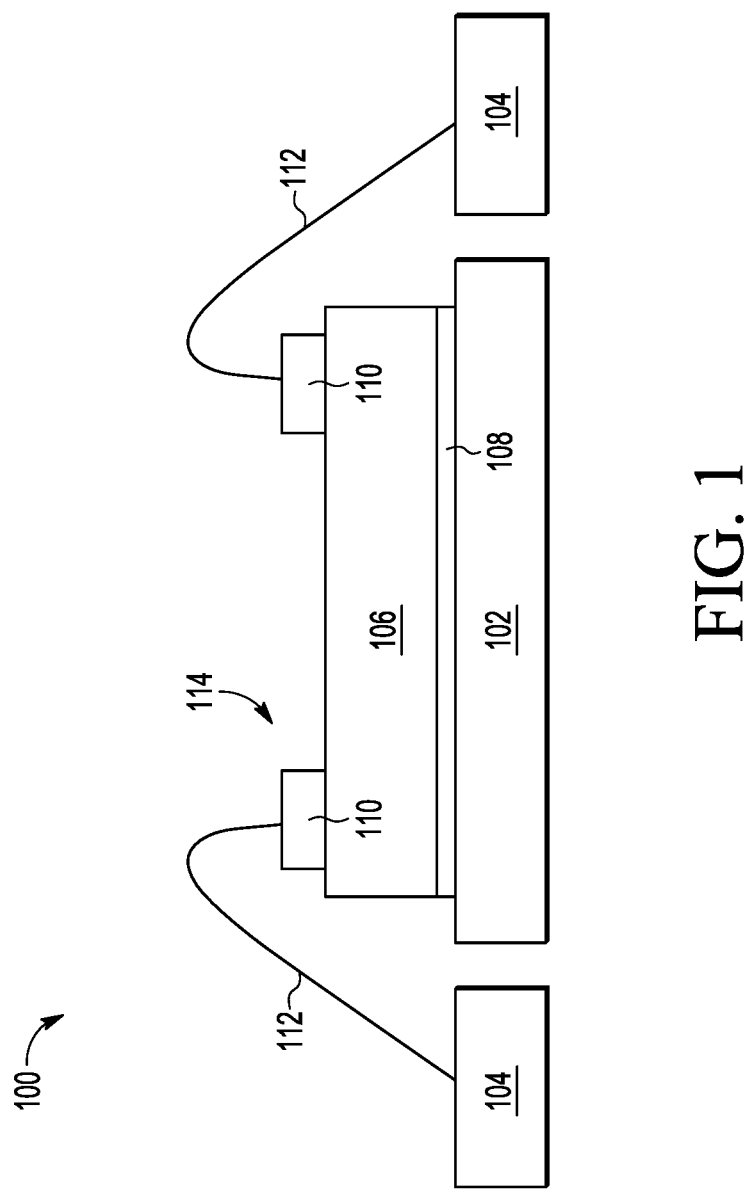
FIG. 1 illustrates, in simplified cross-sectional view, an exemplary semiconductor device formed in accordance with an embodiment of the present invention.

FIG. 1 illustrates, in simplified cross-sectional view, an exemplary semiconductor device 100 at a stage of manufacture in accordance with an embodiment of the present invention. At this stage, exemplary semiconductor device 100 includes a leadframe and a semiconductor die 106. The leadframe includes a flag 102 suitable for attachment of the semiconductor die 106, and plurality of bond terminals 104. The leadframe may be formed of any suitable electrically conductive material, such as aluminum, copper, silver, nickel, or iron, or alloys including one or more of these materials, for example. The conductive metal may be bare, partially plated, or plated with another metal or an alloy such as iron/nickel alloy, silver, gold, copper, or the like. In this embodiment, the leadframe is formed from a base metal such as copper and bond terminals 104 include a top surface copper layer formed on the base metal where the top surface copper layer includes copper (Cu) <111>. As used herein, the term Cu <111> refers to copper having <111> grain orientation. In some embodiments, the leadframe may be formed as conductive traces on a printed circuit board or a substrate (e.g., ceramic or silicon).

The flag 102 may be any shape, size, or configuration suitable for an attached semiconductor die. In some embodiments, the flag 102 may be characterized as a downset flag where the plane of the flag 102 is below the plane of the plurality of bond terminals 104. The plurality of bond terminals 104 couple electrical signals between locations at the outside of a finished semiconductor device package and locations within the package such as bond pads on the semiconductor die 106.

The semiconductor die 106 is attached to the flag 102 with an adhesive 108. The adhesive may be a solder alloy, an epoxy, or any suitable die-attach material such as a die-attach film, for example. In some embodiments, semiconductor die 106 may be attached to the flag 102 by way of a eutectic bonding process or sintering process. The semiconductor die 106 includes a plurality of bond pads 110 located at the top major surface of the die. The bond pads 110 may be formed during multiple processing steps. For example, bond pads 110 may be formed having a first portion formed from a top interconnect or metallization layer, and a second portion formed from a subsequent metal deposition or plating as a top surface layer suitable for bond wire attachment. In this embodiment, the first portion is formed from a copper or copper alloy interconnect layer and the second portion is formed from a copper deposition or plating as a top surface layer of Cu <111>. Semiconductor die 106 may be formed from any suitable semiconductor material such as silicon, germanium, gallium arsenide, and the like. Semiconductor die 106 may include any or combination of digital circuits, analog circuits, memory, processor, MEMS, sensors, and the like.

Bond wires 112 electrically couple bond pads 110 on the semiconductor die 106 to the plurality of bond terminals 104 of the leadframe. The bond wires 112 may be formed from a metal comprising copper or copper alloys. The bond wires 112 may be attached to the bond pads 110 of the semiconductor die 106 and the leadframe bond terminals 104 with either ball bonds or wedge bonds or a combination of ball bonds and wedge bonds. For example, ball bonds may be used to attach a first end of bond wires 112 to bond pads 110 of the semiconductor die 106 and wedge bonds may be used to attach the opposite ends of bond wires 112 to the bond terminals 104 of the leadframe.

Figure 2:
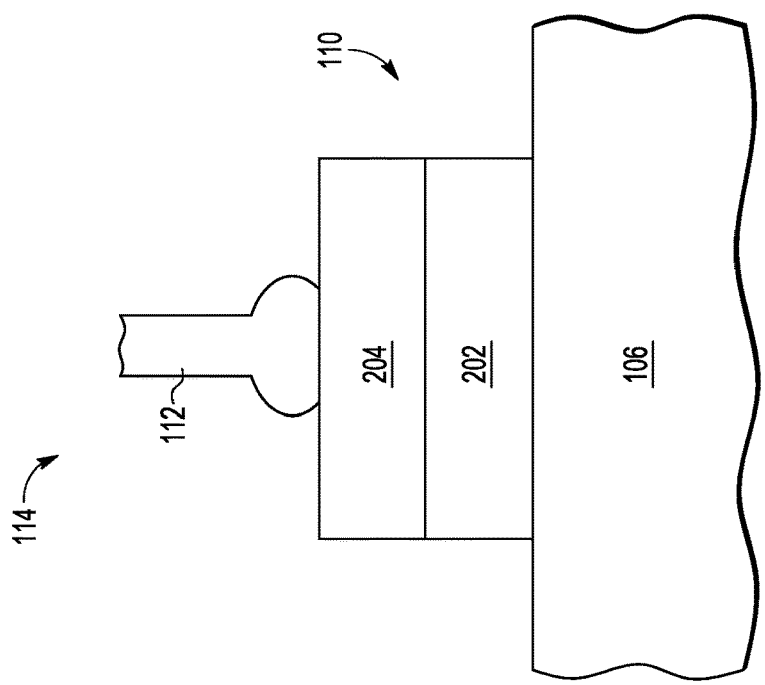
FIG. 2 illustrates, in simplified cross-sectional view, a more detailed bond pad of exemplary semiconductor device formed in accordance with embodiment of the present invention.

FIG. 2 illustrates, in simplified cross-sectional view, a more detailed representation of wire bond region 114 of exemplary semiconductor device 100 formed in accordance with embodiment of the present invention. Wire bond region 114 includes bond wire 112 bonded at a top surface layer 204 of bond pad 110. Top surface layer 204 is formed on a top interconnect metal layer portion 202 of semiconductor die 106. In this embodiment, the top interconnect layer is characterized as the upper-most, or last interconnect layer of semiconductor die 106 and may generally be connected to other circuitry or other interconnect layers. The top interconnect layer is formed from a copper or copper alloy material. To form bond pad 110, Cu <111> is deposited or plated as a top surface layer (204) on the top interconnect layer portion 202. In this embodiment, top surface Cu <111> layer 204 is formed to have a thickness value in the range of 0.2 to 0.6 microns. Other embodiments may have other thickness values. In this embodiment, top surface layer 204 is formed to have a concentration of 60% or greater of Cu <111>. Bond wire 112 is formed from a copper or copper alloy material. In this embodiment, bond wire 112 is formed to have a concentration of 60% or greater of copper. Because the top surface layer 204 of bond pad 110 is formed from Cu <111>, the top surface of layer 204 is less susceptible to oxidation. Accordingly, direct bonding of (copper) bond wire 112 on (copper) bond pad 110 can be accomplished without additional processing steps. A significant advantage having copper bond wires bonded directly on copper bond pads is that intermetallic compound formation and associated corrosion susceptibility are virtually eliminated.

Figure 3:
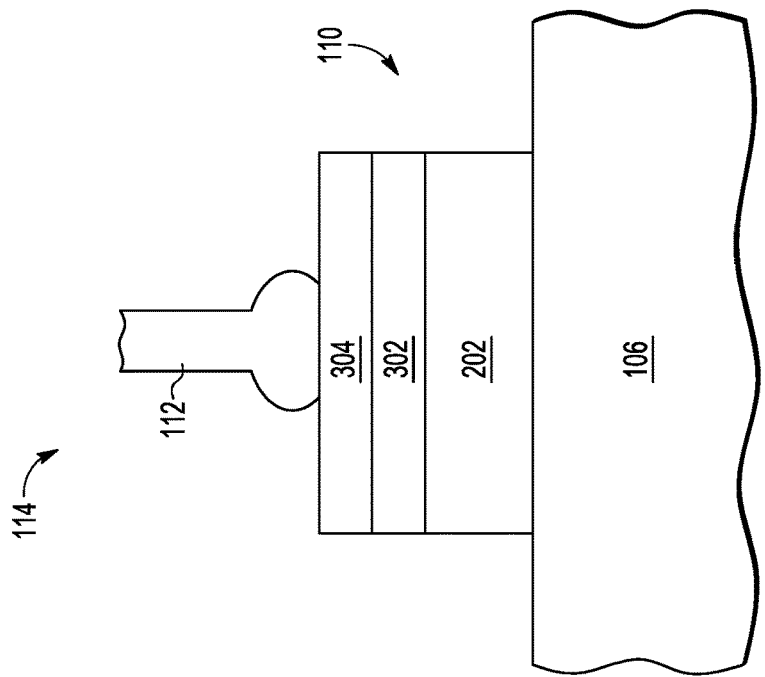
FIG. 3 illustrates, in simplified cross-sectional view, a more detailed bond pad of exemplary semiconductor device formed in accordance with another embodiment of the present invention.

FIG. 3 illustrates, in simplified cross-sectional view, a more detailed representation of wire bond region 114 of exemplary semiconductor device 100 formed in accordance with another embodiment of the present invention. In this embodiment, wire bond region 114 includes bond wire 112 bonded at a top surface layer 304 of bond pad 110. Here, a thin seed layer 302 of Cu <111> is deposited at the top interconnect layer portion 202. A subsequent plating process with copper forms top surface layer 304 as a Cu <111> layer. In this embodiment, top surface Cu <111> layer 304 is formed to have a thickness value in the range of 0.2 to 0.6 microns. Other embodiments may have other thickness values. In this embodiment, top surface layer 304 is formed to have a concentration of 60% or greater of Cu <111>. In this embodiment, the top interconnect layer is characterized as the upper-most or last interconnect layer of semiconductor die 106 and may generally be used to interconnect other circuitry. The top interconnect layer is formed from a copper or copper alloy material. In this embodiment, bond wire 112 is formed from a copper or copper alloy material, and formed to have a concentration of 60% or greater of copper. Because the top surface layer 304 of bond pad 110 is formed from Cu <111>, the top surface of layer 304 is less susceptible to oxidation. Accordingly, direct bonding of (copper) bond wire 112 on (copper) bond pad 110 can be accomplished without additional processing steps.

Figure 4:
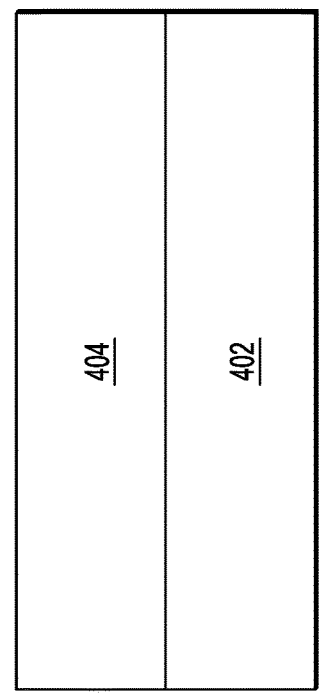
FIG. 4 illustrates, in simplified cross-sectional view, a more detailed bond terminal of exemplary semiconductor device formed in accordance with embodiment of the present invention.

FIG. 4 illustrates, in simplified cross-sectional view, a more detailed representation of a bond terminal 104 of exemplary semiconductor device 100 formed in accordance with embodiment of the present invention. Bond terminal 104 includes a surface layer suitable for attachment of a bond wire. In this embodiment, a top surface layer 404 of bond terminal 104 is formed on a base metal layer portion 402 of the leadframe. The base metal layer portion 402 is formed from a copper or copper alloy material. In other embodiments, base metal layer portion 402 may be formed from other metals or alloys. To form bond terminal 104, Cu <111> is deposited as a top surface layer (404) on the top base metal layer portion 402. In this embodiment, top surface Cu <111> layer 404 is formed to have a thickness value in the range of 0.2 to 0.6 microns. Other embodiments may have other thickness values. In this embodiment, top surface layer 404 is formed to have a concentration of 60% or greater of Cu <111>. Because the top surface layer 404 of bond terminal 104 is formed from Cu <111>, the top surface of layer 404 is less susceptible to oxidation. Accordingly, direct bonding of (copper) bond wire on (copper) bond terminal 104 can be accomplished without additional processing steps. A significant advantage having copper bond wires bonded directly on copper bond terminals is that intermetallic compound formation and associated corrosion susceptibility are virtually eliminated.

Figure 5:
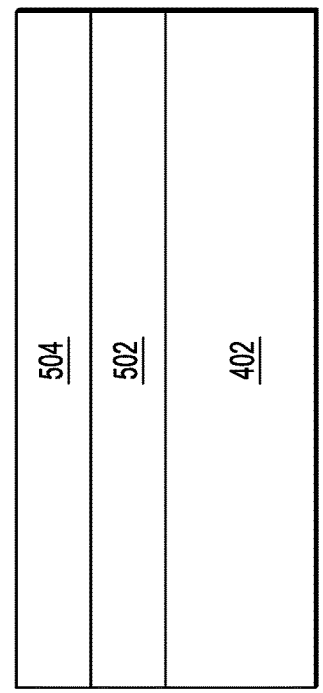
FIG. 5 illustrates, in simplified cross-sectional view, a more detailed bond terminal of exemplary semiconductor device formed in accordance with another embodiment of the present invention.

FIG. 5 illustrates, in simplified cross-sectional view, a more detailed representation of a bond terminal 104 of exemplary semiconductor device 100 formed in accordance with another embodiment of the present invention. Bond terminal 104 includes a surface layer suitable for attachment of a bond wire. In this embodiment, a thin seed layer 502 of Cu <111> is deposited on the base metal layer portion 402 of the leadframe. A subsequent plating process with copper forms top surface layer 504 as a Cu <111> layer. In this embodiment, top surface Cu <111> layer 504 is formed to have a thickness value in the range of 0.2 to 0.6 microns. Other embodiments may have other thickness values. In this embodiment, top surface layer 504 is formed to have a concentration of 60% or greater of Cu <111>. Because the top surface layer 504 of bond terminal 104 is formed from Cu <111>, the top surface of layer 504 is less susceptible to oxidation. Accordingly, direct bonding of (copper) bond wire on (copper) bond terminal 104 can be accomplished without additional processing steps.

Figures 6, 7, 8:
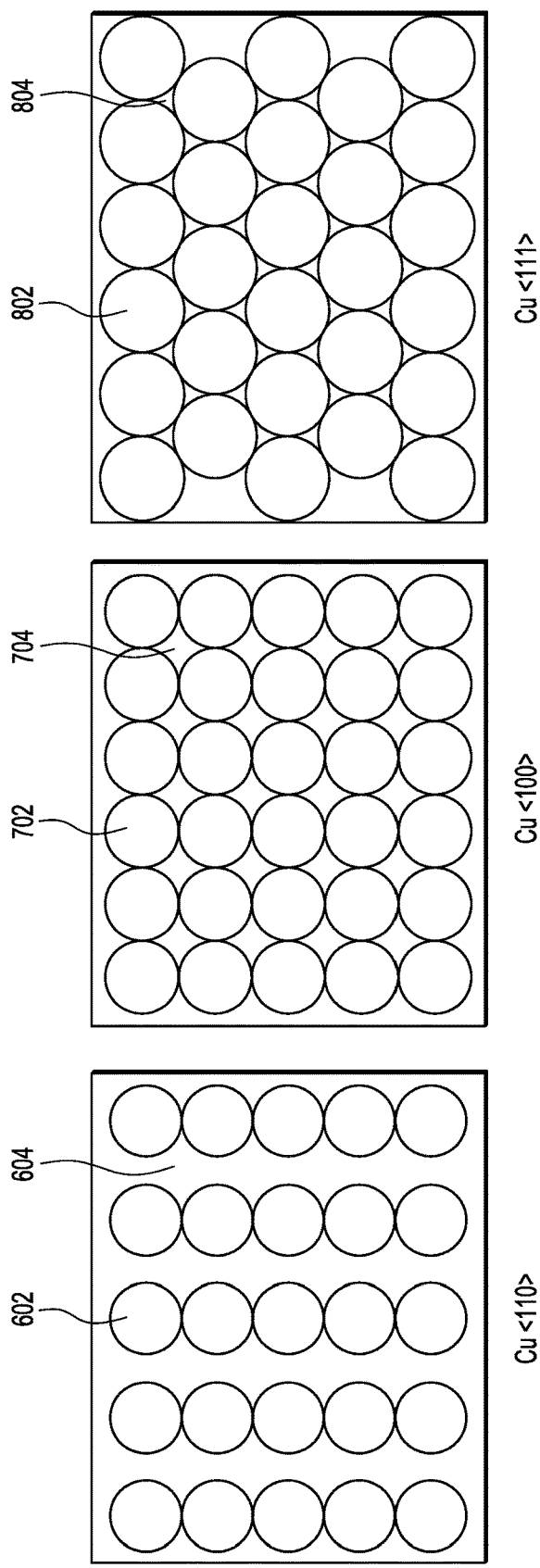
FIG. 6 through FIG. 8 illustrates, in simplified surface schematic views, various grain orientations in accordance with an embodiment of the present invention.

FIG. 6 through FIG. 8 illustrates, in simplified surface schematic views, various grain orientations in accordance with an embodiment of the present invention. FIG. 6 through FIG. 8 shows surface diagrams for copper having <110>, <100>, and <111> grain orientations, respectively.

FIG. 6 illustrates, in simplified surface schematic view, a diagram of copper having <110> grain orientation (Cu <110>) in accordance with an embodiment of the present invention. Cu <110> as depicted in FIG. 6, includes the circular shapes 602 are representative of crystal or crystalline grains in the <110> orientation. Among the grain orientations depicted in FIG. 6 through FIG. 8, Cu <110> has the lowest density of a surface plane of copper as shown by the large void area 604 between grains. Cu <110> is deemed least stable and would generally form a significant amount of oxide when subjected to subsequent heat cycles.

FIG. 7 illustrates, in simplified surface schematic view, a diagram of copper having <100> grain orientation (Cu <100>) in accordance with an embodiment of the present invention. Cu <100> as depicted in FIG. 7, includes circular shapes 702 representative of crystalline grains formed in the <100> orientation. Among the grain orientations depicted in FIG. 6 through FIG. 8, Cu <110> has the next lowest density of a surface plane of copper as shown by the medium void area 704 between grains. Cu <100> is deemed more stable than Cu <110> depicted in FIG. 6, and would generally form a less significant amount of oxide when subjected to subsequent heat cycles.

FIG. 8 illustrates, in simplified surface schematic view, a diagram of copper having <111> grain orientation (Cu <111>) in accordance with an embodiment of the present invention. Cu <111> as depicted in FIG. 8, includes circular shapes 802 representative of crystalline grains formed in the <111> orientation. Among the grain orientations depicted in FIG. 6 through FIG. 8, Cu <111> has the highest density of a surface plane of copper as shown by the minimal void area 804 between grains. Cu <111> is deemed more stable than Cu <100> depicted in FIG. 7, and would generally form a very small or negligible amount of oxide when subjected to subsequent heat cycles. As such, Cu <111> when formed on bonding surfaces, provides a superior surface for attaching copper bond wires. Another advantage having copper bond wires bonded directly on Cu <111> surfaces is that intermetallic compound formation and associated corrosion susceptibility are virtually eliminated.

Generally, there is provided, a device including a leadframe having a flag and a plurality of bond terminals; a semiconductor die attached to the leadframe at the flag; a bond pad formed on the semiconductor die, the bond pad having a top surface layer comprising copper having <111> grain orientation (Cu <111>); and a bond wire having a first end and a second end, the bond wire attached to the bond pad at the first end and attached to one of the bond terminals in the plurality at the second end. The bond wire may include a 60% or higher concentration of copper. The top surface layer including Cu <111> may be formed on a top interconnect layer of the semiconductor die, the top interconnect layer including copper. The top surface layer including Cu <111> may be formed by depositing a Cu <111> seed layer and electroplating with copper. The top surface layer including Cu <111> may have a thickness in a range of 0.2 microns to 0.6 microns. The top surface layer including Cu <111> may include a concentration of at least 60% Cu <111>. A top bonding surface of the one of the bond terminals in the plurality may include Cu <111>, the top bonding surface formed on a base metal of the leadframe. The top bonding surface of the one of the bond terminals in the plurality may be formed by depositing a Cu <111> seed layer and electroplating with copper. The top bonding surface of the one of the bond terminals in the plurality may include a concentration of at least 60% Cu <111>.

In another embodiment, there is provided, a device including a leadframe comprising a flag and a bond terminal, a top surface of the bond terminal comprising copper having <111> grain orientation (Cu <111>); a semiconductor die attached to the leadframe at the flag; a bond pad formed on the semiconductor die, a top surface of the bond pad comprising Cu <111>; and a bond wire comprising copper having a first end and a second end, the bond wire attached directly to the top surface of the bond pad with a ball bond at the first end and attached to the top surface of the bond terminal at the second end. The bond wire may include a 60% or higher concentration of copper. The top surface of the bond pad including Cu <111> may be formed on a top interconnect layer of the semiconductor die, the top interconnect layer comprising copper. The top surface of the bond pad including Cu <111> may have a thickness in a range of 0.2 microns to 0.6 microns. The top surface of the bond pad Cu <111> may include a concentration of at least 60% Cu <111>. The top surface of the bond terminal including Cu <111> may be formed on a base metal of the leadframe, the base metal comprising copper. The top surface of the bond terminal including Cu <111> may include a concentration of at least 60% Cu <111>.

In yet another embodiment, there is provided, a method including forming an interconnect layer on a semiconductor die; depositing copper having <111> grain orientation (Cu <111>) on at least a portion of the interconnect layer to form a top surface of a bond pad; attaching the semiconductor die to a flag of a leadframe; attaching a first end of a bond wire comprising copper to the top surface of the bond pad; and attaching a second end of the bond wire to a bond terminal of the leadframe. The top surface of the bond pad including Cu <111> may have a thickness in a range of 0.2 microns to 0.6 microns. The bond terminal may include forming a top surface layer of Cu <111> on a base metal of the leadframe, the base metal comprising copper. The top surface of the bond pad and the top surface layer of the bond terminal each may include a concentration of at least 60% Cu <111>.

By now it should be appreciated that there has been provided, a bond pad structure and method of forming the same. By forming a top surface layer of copper having a <111> grain orientation (Cu <111>) on a bond pad, a copper bond wire can be attached without additional processing steps. Copper offers superior conductivity characteristics with modest costs when compared with other choices for pad metals and bond wires. The Cu <111> top surface layer may be formed by deposition or plating. The Cu <111> top surface layer has minimal oxide growth due to the grain density and allows for direct bonding with a copper bond wire. By directly attaching copper bond wires on Cu <111> bond pads, intermetallic compound formation and associated corrosion susceptibility are virtually eliminated.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A device comprising:
   a leadframe having a flag and a plurality of bond terminals;
   a semiconductor die attached to the leadframe at the flag;
   a bond pad formed on the semiconductor die, the bond pad having a top surface layer comprising copper having <111> grain orientation (Cu <111>); and
   a bond wire having a first end and a second end, the bond wire attached to the bond pad at the first end and attached to one of the bond terminals in the plurality at the second end.

2. The device of claim 1, wherein the bond wire comprises a 60% or higher concentration of copper.

3. The device of claim 1, wherein the top surface layer comprising Cu <111> is formed on a top interconnect layer of the semiconductor die, the top interconnect layer comprising copper.

4. The device of claim 3, wherein the top surface layer comprising Cu <111> is formed by depositing a Cu <111> seed layer and electroplating with copper.

5. The device of claim 1, wherein the top surface layer comprising Cu <111> has a thickness in a range of 0.2 microns to 0.6 microns.

6. The device of claim 1, wherein the top surface layer comprising Cu <111> comprises a concentration of at least 60% Cu <111>.

7. The device of claim 1, wherein a top bonding surface of the one of the bond terminals in the plurality comprises Cu <111>, the top bonding surface formed on a base metal of the leadframe.

8. The device of claim 7, wherein the top bonding surface of the one of the bond terminals in the plurality is formed by depositing a Cu <111> seed layer and electroplating with copper.

9. The device of claim 7, wherein the top bonding surface of the one of the bond terminals in the plurality comprises a concentration of at least 60% Cu <111>.

10. A device comprising:
a leadframe comprising a flag and a bond terminal, a top surface of the bond terminal comprising copper having <111> grain orientation (Cu <111>);
a semiconductor die attached to the leadframe at the flag;
a bond pad formed on the semiconductor die, a top surface of the bond pad comprising Cu <111>; and
a bond wire comprising copper having a first end and a second end, the bond wire attached directly to the top surface of the bond pad with a ball bond at the first end and attached to the top surface of the bond terminal at the second end.

11. The device of claim 10, wherein the bond wire comprises a 60% or higher concentration of copper.

12. The device of claim 10, wherein the top surface of the bond pad comprising Cu <111> is formed on a top interconnect layer of the semiconductor die, the top interconnect layer comprising copper.

13. The device of claim 10, wherein the top surface of the bond pad comprising Cu <111> has a thickness in a range of 0.2 microns to 0.6 microns.

14. The device of claim 10, wherein the top surface of the bond pad Cu <111> comprises a concentration of at least 60% Cu <111>.

15. The device of claim 10, wherein the top surface of the bond terminal comprising Cu <111> is formed on a base metal of the leadframe, the base metal comprising copper.

16. The device of claim 10, wherein the top surface of the bond terminal comprising Cu <111> comprises a concentration of at least 60% Cu <111 >.

17. A method comprising:
forming an interconnect layer on a semiconductor die;
depositing copper having <111> grain orientation (Cu <111>) on at least a portion of the interconnect layer to form a top surface of a bond pad;
attaching the semiconductor die to a flag of a leadframe;
attaching a first end of a bond wire comprising copper to the top surface of the bond pad; and
attaching a second end of the bond wire to a bond terminal of the leadframe.

18. The method of claim 17, wherein the top surface of the bond pad comprising Cu <111> has a thickness in a range of 0.2 microns to 0.6 microns.

19. The method of claim 17, wherein the bond terminal comprises forming a top surface layer of Cu <111> on a base metal of the leadframe, the base metal comprising copper.

20. The method of claim 18, wherein the top surface of the bond pad and the top surface layer of the bond terminal each comprise a concentration of at least 60% Cu <111>.

* * * * *